United States Patent
Lin et al.

(10) Patent No.: US 8,911,559 B2
(45) Date of Patent: Dec. 16, 2014

(54) METHOD TO PRE-HEAT AND STABILIZE ETCHING CHAMBER CONDITION AND IMPROVE MEAN TIME BETWEEN CLEANING

(75) Inventors: Yu Chao Lin, Rende Township, Tainan County (TW); Ryan Chia-Jen Chen, Chiayi (TW); Yih-Ann Lin, Jhudong Township, Hsinchu County (TW); Jr Jung Lin, Wurih Township, Taichung County (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 452 days.

(21) Appl. No.: 12/463,243

(22) Filed: May 8, 2009

(65) Prior Publication Data

US 2010/0071719 A1 Mar. 25, 2010

Related U.S. Application Data

(60) Provisional application No. 61/099,009, filed on Sep. 22, 2008.

(51) Int. Cl.
*B08B 5/00* (2006.01)
*B08B 7/04* (2006.01)
*H01J 37/32* (2006.01)

(52) U.S. Cl.
CPC ........ *H01J 37/32862* (2013.01); *Y10S 438/905* (2013.01)
USPC .............. 134/1.1; 134/21; 134/22.1; 134/30; 216/67; 438/905

(58) Field of Classification Search
CPC .... B08B 7/0035; B08B 5/00; C23C 16/4405; H01J 37/32862; H01L 21/02661; Y10S 438/905
USPC .......... 134/1.1, 21, 30, 22.1; 216/67; 438/905
See application file for complete search history.

(56) References Cited

U.S. PATENT DOCUMENTS

| | | | | |
|---|---|---|---|---|
| 6,060,397 A | * | 5/2000 | Seamons et al. | 438/694 |
| 6,125,859 A | * | 10/2000 | Kao et al. | 134/1.1 |
| 6,544,345 B1 | * | 4/2003 | Mayer et al. | 134/28 |
| 6,596,091 B1 | * | 7/2003 | Grosenbacher | 134/21 |
| 6,843,858 B2 | * | 1/2005 | Rossman | 134/30 |
| 7,028,696 B2 | * | 4/2006 | Richardson et al. | 134/1.1 |
| 7,159,597 B2 | * | 1/2007 | Hua et al. | 134/1.1 |
| 2004/0071897 A1 | * | 4/2004 | Verplancken et al. | 427/569 |
| 2005/0257890 A1 | * | 11/2005 | Park et al. | 156/345.35 |
| 2006/0090773 A1 | * | 5/2006 | Choi et al. | 134/1.1 |

FOREIGN PATENT DOCUMENTS

CN 101214487 7/2008

* cited by examiner

*Primary Examiner* — Michael Kornakov
*Assistant Examiner* — Natasha Campbell
(74) *Attorney, Agent, or Firm* — Haynes and Boone, LLP

(57) ABSTRACT

A method for cleaning an etching chamber is disclosed. The method comprises providing an etching chamber; introducing a first gas comprising an inert gas into the etching chamber for a first period of time; and transporting a first wafer into the etching chamber after the first period of time, wherein the first wafer undergoes an etching process.

15 Claims, 2 Drawing Sheets

METHOD TO PRE-HEAT AND STABILIZE ETCHING CHAMBER CONDITION AND IMPROVE MEAN TIME BETWEEN CLEANING

PRIORITY DATA

This application claims priority to Provisional Application Ser. No. 61/099,009 filed on Sep. 22, 2008, entitled "A METHOD TO PRE-HEAT AND STABILIZE ETCHING CHAMBER CONDITION AND IMPROVE MEAN TIME BETWEEN CLEANING," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. These advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling-down requires minimal tolerance for impurities and contaminants present during the processing and manufacturing of ICs. The presence of even small amounts of impurities and contaminants negatively affects the fabrication processes and resulting fabricated devices. Current efforts to reduce contamination arising from external sources (e.g., human sources) and internal sources (e.g., within the process chambers) include improving the quality of clean rooms, utilizing automated equipment to minimize exposure, and introducing various cleaning methods within process chambers. However, particularly when dealing with contaminated process chambers, conventional cleaning methods still produce undesirable results. For example, when considering individual wafer lots, current cleaning methods produce a first wafer effect and poor wafer to wafer critical dimension difference within a wafer lot. This requires each wafer lot to include a few dummy wafers to undergo processing so that all the actual wafers processed reflect uniform critical dimensions and properties, resulting in increased costs and increased production times. Further, current cleaning methods require longer than desirable cleaning times between wafer lots, resulting in increased mean time between clean of wafer lots and increased damage to the exposed process chambers.

Accordingly, what is needed is a method for cleaning process chambers that addresses the above stated issues.

SUMMARY

The present embodiments provide a solution a method for pre-heating and stabilizing an etching chamber condition. In one embodiment, a method for pre-conditioning and stabilizing an etching chamber comprises providing the etching chamber; introducing a first gas comprising an inert gas into the etching chamber; and transporting a first wafer into the etching chamber, wherein the first wafer undergoes an etching process.

In one embodiment, a method for cleaning an etching chamber comprises providing a plurality of wafer lots including at least one wafer; transporting the at least one wafer of each of the plurality of wafer lots into the etching chamber, wherein the at least one wafer of each of the plurality of wafer lots undergoes an etching process; and introducing a first gas comprising an inert gas into the etching chamber prior to transporting the at least one wafer of each of the plurality of wafer lots into the etching chamber.

In one embodiment, a method for cleaning a process chamber, wherein the process chamber includes an etching chamber, comprises providing a wafer lot comprising a plurality of wafers; transporting each of the plurality of wafers into the etching chamber to undergo an etching process; introducing a first gas into the etching chamber before a first wafer of the plurality of wafers is transported into the etching chamber, wherein the first gas comprises an inert gas; and introducing a second gas into the etching chamber between each of the plurality of wafers being transported into the etching chamber.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

DETAILED DESCRIPTION

Figure 1:
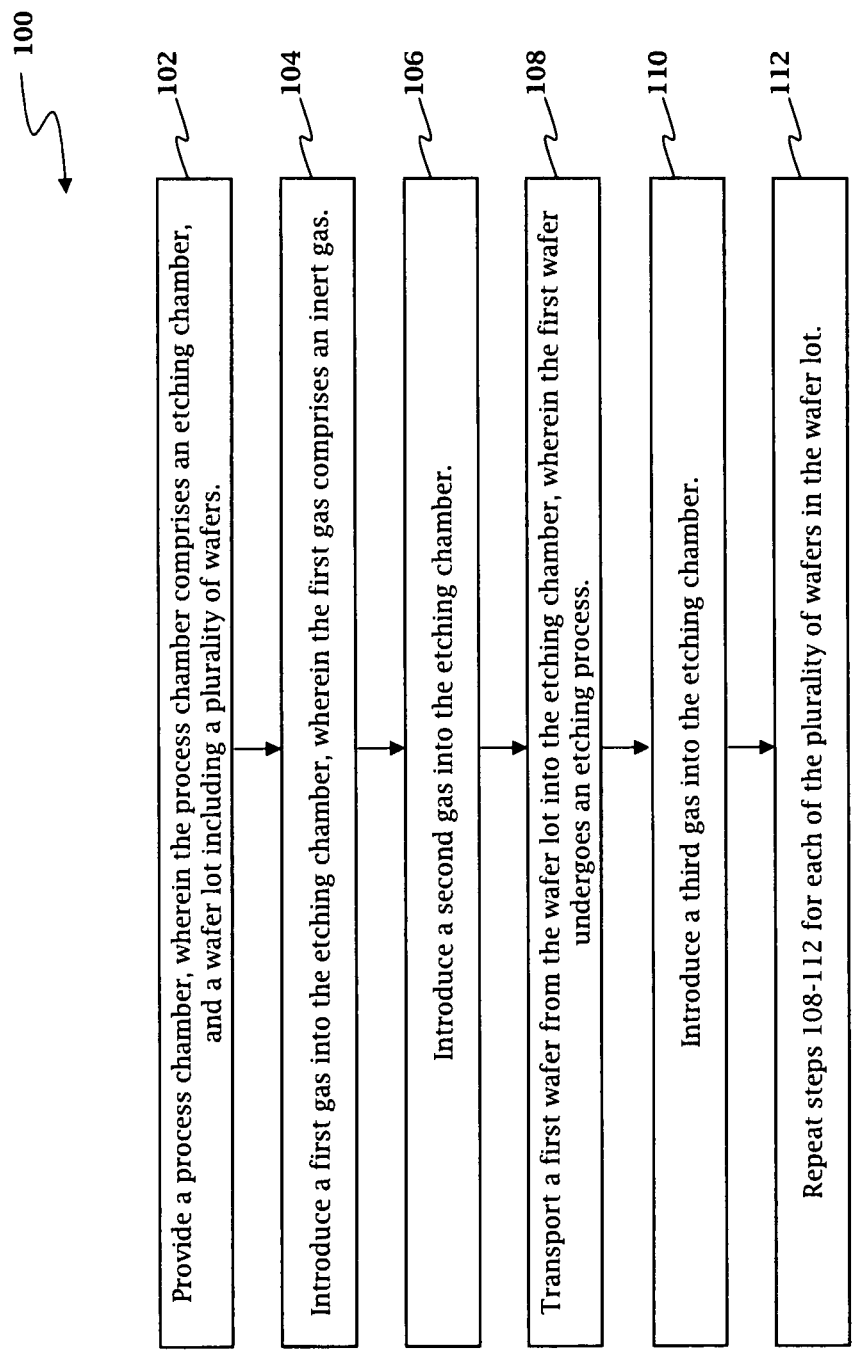
FIG. 1 is a flow chart of a method for cleaning a process chamber according to aspects of the present embodiments.

The present disclosure relates generally to methods for cleaning process chambers, and more particularly, to a method for cleaning an etching chamber.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 2:
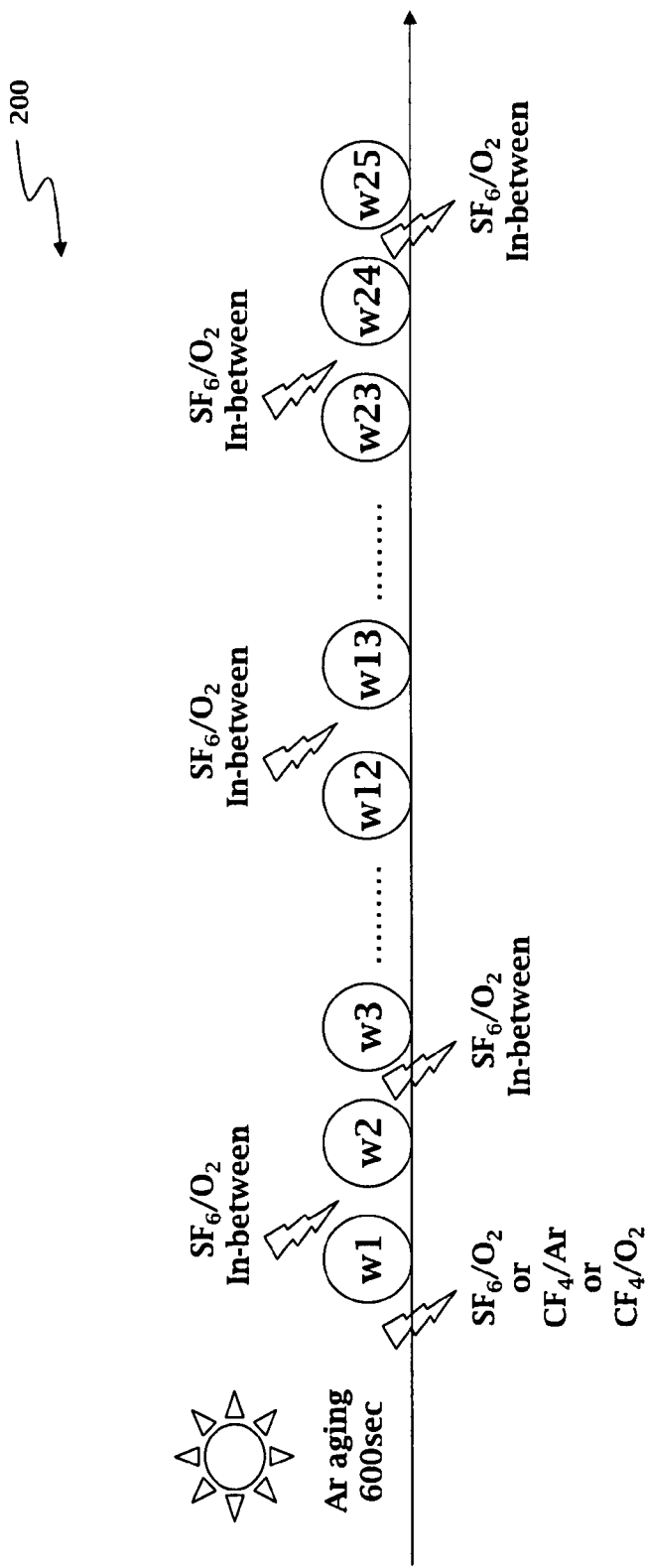
FIG. 2 is a timeline according to one embodiment during various stages of the method of FIG. 1.

With reference to FIGS. 1 and 2, a method 100 is described below. FIG. 1 is a flow chart of one embodiment of the method 100 for pre-heating and stabilizing a process chamber. FIG. 2 is a timeline 200 according to one embodiment, in portion or entirety, during various stages of the method 100. It is understood that additional steps can be provided before, during, and after the method 100, and some of the steps described below can be replaced or eliminated, for additional embodiments of the method. It is further understood that additional features can be added in the timeline 200, and some of the features described below can be replaced or eliminated, for additional embodiments of the timeline 200. The present embodiment of method 100 effectively reduces contaminates and impurities within process chambers. Specifically, the method 100 provides a pre-heating and stabilizing treatment for process chambers that eliminates process chamber damage and reduces processing times, wafer to wafer critical dimension variation, and first wafer effect.

Referring to FIGS. 1 and 2, the method 100 begins at step 102 wherein a wafer lot including at least one wafer and a process chamber is provided. It is understood that a plurality of process chambers and/or a plurality of wafer lots may be provided.

The wafer lot comprises the at least one wafer, and in some embodiments, comprises a plurality of wafers. A wafer includes a substrate (e.g., a semiconductor substrate), a mask (photomask or reticle, collectively referred to as mask), or any base material on which processing is conducted to produce layers of material, pattern features, and/or integrated circuits. In the present embodiment, as illustrated in FIG. 2, the wafer lot comprises twenty-five wafers, wafers W1, W2, W3, . . . , through W25. In alternate embodiments, the wafer lot may comprise more or less wafers than illustrated. Each of the wafers, W1 through W25, may be transported into the process chamber to undergo processing.

The process chamber may comprise any suitable process chamber. In the present embodiment, the process chamber is an etching chamber. The etching chamber may comprise any component suitable for accomplishing an etching process. For example, the etching chamber may comprise an enclosure having a plurality of walls, a set of doors, a robotic system for transporting wafers, at least one gas providing system, at least one exhaust system, an air circulation system, a particle filter, an outlet system, any other suitable component, and/or combinations thereof.

The process chamber may be utilized for any suitable process. In the present embodiment, the process chamber is utilized for etching processes. The etching processes may include dry etching, wet etching, and/or other etching methods (e.g., reactive ion etching). The etching process may also be either purely chemical (plasma etching), purely physical (ion milling), and/or combinations thereof. In one example, the etching chamber is a high-k/metal gate etching chamber. In another example, the etching chamber is a non-high-k material etching chamber. In some embodiments, the etching chamber is a polysilicon etching chamber. Further, the etching chamber performs etching processes for gate-first processing and/or gate-last processing. In the present embodiment, the etching chamber is a high-k/metal gate etching chamber.

In some embodiments, the process chamber may be for deposition and/or photolithography patterning processes. The deposition processes may include chemical vapor deposition (CVD), physical vapor deposition (PVD), atomic layer deposition (ALD), sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint.

In the present embodiment, during an etching process, a plurality of pattern features are formed in the wafer. The plurality of pattern features include many small or tight features, which are defined by the critical dimension (e.g., gate width, the minimum width of a line or the minimum space between two lines permitted in the fabrication of the wafer). Dimensional and geometrical variations of the pattern features may result during the wafer fabrication process. For example, significant variations result in the critical dimensions of each wafer in a wafer lot (i.e., wafer to wafer critical dimension (WTW CD) difference). Such variations arise, in some cases, from byproducts left after each etching process and processes used to stabilize the etching chamber prior to receiving a wafer. Also, a first wafer effect arises, wherein the critical dimension of the first few wafers of a wafer lot varies significantly from the remainder of the wafers of the wafer lot. Current remedies for preventing the first wafer effect and poor WTW CD difference include providing the wafer lot with seasoned wafers (e.g., dummy wafers) as the first few wafers to undergo processing until the critical dimension variations are diminished, and the remaining wafers of the wafer lot result in uniform critical dimensions.

Typically, prior to a first wafer of the wafer lot and between each wafer of the wafer lot being transported into the etching chamber to undergo processing, various procedures are utilized to stabilize the etching chamber (e.g., pre-heating the chamber to a desirable temperature) and clean the etching chamber free of byproducts left behind by previous processing. For example, a combination of gases, such as $SF_6$ and $O_2$, pre-conditions the etching chamber before etching of any of the wafers in the wafer lot, and the $SF_6/O_2$ mixture is provided to clean the etching chamber between each wafer of the wafer lot undergoing etching. It has been observed that the $SF_6/O_2$ mixture yields a first wafer effect and produces poor WTW CD difference. Further, the $SF_6/O_2$ mixture pre-conditioning requires a longer than desirable time, approximately 1500 seconds (25 minutes), thus a longer than desirable mean time between clean (MTBC) of wafer lots. The longer cleaning time required by the $SF_6/O_2$ mixture results in damage to the etching chamber (e.g., quartz damage and/or O-ring damage) and poor particle performance.

Accordingly, the present embodiment provides a method wherein an inert gas pre-heats and stabilizes the etching chamber without causing chamber damage. Specifically, the present embodiment introduces a first gas into the etching chamber at step 104. The first gas comprises an inert gas for aging or pre-seasoning the etching chamber. The inert gas may comprise argon, helium, neon, krypton, xenon, nitrogen, other suitable gases, and/or combinations thereof. The first gas may be introduced into the etching chamber at any suitable flow rate for any suitable time. Further, the etching chamber may be maintained at any suitable pressure for providing the first gas, and any suitable power source (e.g., RF power) and bias source may be utilized.

In the present embodiment, at step 104, the first gas comprises argon, which is introduced into the etching chamber. The argon is introduced by maintaining the etching chamber at a pressure of approximately 3.8 mTorr and providing the argon at a flow rate of approximately 50 to about 1000 sccm (standard cubic centimeters per minute) for a time period of approximately 600 seconds (10 minutes). Introducing the argon into the process chamber further comprises utilizing a source power of approximately 100 to about 3000 Watts and a bias power of approximately 0 Watts. In alternate embodiments, a plasma condition range may be larger. Also, a wall temperature of the etching chamber is maintained at approximately 50° C. to 80° C. In some embodiments, an electrostatic (ESC) chuck is provided at varying temperatures. For example, the ESC chuck may be provided with temperatures of 35° C. at the center, 30° C. at the middle, and 30° C. at the edges. In some embodiments, the first gas may be introduced into the etching chamber multiple times.

The first gas treatment effectively removes contaminants and impurities from the process chamber, providing a more desirable environment to manufacture the wafers. Utilizing an inert gas as the first gas pre-heats and stabilizes the etching chamber to a desired temperature environment without damaging parts of the etching chamber. Essentially no chamber surfaces are impacted by pre-conditioning the chamber with an inert gas. Also, the inert gas treatment may be completed much quicker, not requiring the longer $SF_6/O_2$ mixture cleaning time, which improves the MTBC of wafer lots and wafers processed per hour, significantly reducing the costs associated with processing the wafers. Further, the inert gas treatment avoids the first wafer effect, eliminating the need of replacing the first few wafers of the wafer lot with dummy wafers; and the inert gas treatment improves the WTW CD difference (i.e., the resulting critical dimensions of each wafer in a wafer lot are substantially uniform).

At step 106, a second gas may be introduced into the etching chamber. The second gas comprises $SF_6$, $O_2$, $CF_4$, Ar, other suitable gases, and/or combinations thereof. In some embodiments, the second gas introduced into the etching chamber comprises a combination of $SF_6$ and $O_2$. In other embodiments, the second gas introduced into the etching chamber comprises a combination of $CF_4$ and Ar. In yet other embodiments, the second gas introduced into the etching chamber comprises a combination of $CF_4$ and $O_2$. The second gas may be introduced into the etching chamber at any suitable flow rate for any suitable time. For example, the second gas including $SF_6$ and $O_2$ (and optionally Ar) may be introduced into the etching chamber for a time period of approximately 180 seconds (3 minutes). The flow rate of $SF_6$ ranges from about 100 to about 1000 sccm, the flow rate of 02 ranges from about 10 to about 300 sccm, and the flow rate of Ar ranges from about 10 to about 1000 sccm. Introducing the second gas into the process chamber further comprises utilizing a source power of approximately 100 to about 3000 Watts. Also, a wall temperature of the etching chamber is maintained at approximately 50° C. to 80° C. In some embodiments, an electrostatic (ESC) chuck is provided at varying temperatures. For example, the ESC chuck may be provided with temperatures of 35° C. at the center, 30° C. at the middle, and 30° C. at the edges. Further, the etching chamber may be maintained at any suitable pressure for providing the second gas, and any suitable power source and bias source may be utilized. It is understood that step 106 may be omitted or repeated in alternate embodiments.

As illustrated in FIG. 2, the first gas and the second gas are introduced into the etching chamber before any of the wafers of the wafer lot are transported into the etching chamber. Then, a first wafer of the wafer lot, W1, is transported into the etching chamber at step 108, wherein the first wafer undergoes an etching process. As noted above, the etching process may include dry etching, wet etching, plasma etching, and/or other etching methods (e.g., reactive ion etching). In the present embodiment, the first wafer does not exhibit the first wafer effect as discussed above, and instead results in a critical dimension substantially similar to subsequently processed wafers of the wafer lot, thus eliminating the need for a dummy wafer as the first wafer. It is understood that introducing the first gas and introducing the second gas may occur in any order and, in some embodiments, may include repeating each. In some embodiments, the first gas and second gas may be introduced into the etching chamber after the first wafer of the wafer lot has been transported into the etching chamber.

At step 110, a third gas is introduced into the etching chamber. It is understood that the etched first wafer may be removed before or after the third gas is provided to the etching chamber. The third gas comprises $SF_6$, $O_2$, $CF_4$, Ar, other suitable gases, and/or combinations thereof. In the present embodiment, the third gas introduced into the etching chamber comprises a combination of $SF_6$ and $O_2$ (and optionally Ar). In other embodiments, the third gas introduced into the etching chamber comprises a combination of $CF_4$ and Ar. In yet other embodiments, the third gas introduced into the etching chamber comprises a combination of $CF_4$ and $O_2$. In other embodiments, the third gas may comprise gases chosen depending on the particular etching process utilized within the etching chamber. The third gas may be introduced into the etching chamber at any suitable flow rate for any suitable time. For example, the third gas may be introduced into the etching chamber for a time period of approximately 60 seconds (1 minute). The flow rate of $SF_6$ ranges from about 100 to about 1000 sccm, the flow rate of 02 ranges from about 10 to about 300 sccm, and the flow rate of Ar ranges from about 10 to about 1000 sccm. Introducing the third gas into the process chamber further comprises utilizing a source power of approximately 100 to about 3000 Watts. Also, a wall temperature of the etching chamber is maintained approximately 50° C. to 80° C. In some embodiments, an electrostatic (ESC) chuck is provided at varying temperatures. For example, the ESC chuck may be provided with temperatures of 35° C. at the center, 30° C. at the middle, and 30° C. at the edges. Further, the etching chamber may be maintained at any suitable pressure for providing the third gas, and any suitable power source and bias source may be utilized. In some embodiments, the third gas may be introduced into the etching chamber multiple times. In alternate embodiments, the third gas may be introduced in conjunction with the first gas and the second gas in any suitable sequence.

At step 112, and as further illustrated in FIG. 2, steps 108 through 112 are repeated for each of the wafers in the wafer lot. In the present embodiment, steps 108 through 112 are repeated for wafers W2 through W25. For example, after introducing the third gas into the etching chamber, W2 is transported into the etching chamber where it undergoes an etching process. W2 is then removed and the third gas is again introduced into the etching chamber. Subsequently, W3 is transported into the etching chamber, and so on, until each wafer in the wafer lot is transported into the etching chamber and undergoes an etching process. In some embodiments, the method 100 repeats continuously, until a plurality of wafer lots, each comprising at least one wafer, has been processed. Further, in alternate embodiments, the first gas may be utilized between each wafer being transported into the etching chamber.

The present embodiments, including an inert gas treatment to an etching chamber prior to the processing of each wafer lot, provides a solution to pre-heating and stabilizing the etching chamber while eliminating damage to the etching chamber. Overall, the disclosed embodiments provide one or more of the following advantages: (1) reduced contaminates and impurities within the process chamber; (2) eliminated first wafer effect; (3) improved wafer to wafer critical dimension variations; (4) minimized damage experienced by the process chambers; (5) improved mean time between cleanings; (6) reduced costs incurred to process a wafer lot; and (7) increased number of wafers per hour may be processed. It is understood that different embodiments may have different advantages, and that no particular advantage is necessarily required of all embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for pre-conditioning and stabilizing an etching chamber, the method comprising:
    providing the etching chamber initializing a cleaning process of the etching chamber by;
    introducing a first gas comprising only argon gas into the etching chamber, wherein the first gas is introduced having the etching chamber at a temperature that maintains the walls of the etching chamber at a temperature of approximately 50° C. to 80° C. until the stopping of introducing the first gas wherein introducing the first gas comprises utilizing a source power of approximately 100 to about 3000 Watts and bias power of approximately 0 Watts;
    after stopping introducing the first gas continuing the cleaning process by, introducing a second gas for a second time period, wherein the second gas is operable to clean the etching chamber and includes at least one of $CF_4$ and Ar and $CF_4$ and $O_2$; and
    transporting a first wafer into the etching chamber after the first period of time, wherein the first wafer undergoes an etching process.

2. The method of claim 1 wherein introducing the first gas comprises maintaining the etching chamber at a pressure of approximately 3.8 mTorr, providing the first gas in the etching chamber at a flow rate of approximately 50 to about 1000 sccm, and the first time period of approximately 600 seconds.

3. The method of claim 1 wherein the introducing the second gas comprises providing a flow rate of approximately 100 to about 1000 sccm, providing $O_2$ at a flow rate approximately 10 to about 300 sccm, introducing the second gas for the second time period of approximately 180 seconds, and maintaining the walls of the etching chamber at a temperature of approximately 50° C. to 80° C.

4. The method of claim 1 wherein introducing the second gas comprises utilizing a source power of approximately 100 to about 3000 Watts.

5. The method of claim 1 further comprising:
    introducing a third gas into the etching chamber for a third period of time after the first wafer undergoes the etching process; and
    transporting a second wafer into the etching chamber after the third period of time, wherein the second wafer undergoes the etching process.

6. The method of claim 5 wherein the third gas comprises a combination of $SF_6$ and $O_2$; $CF_4$ and Ar; or $CF_4$ and $O_2$.

7. The method of claim 6 wherein introducing the third gas comprises providing $SF_6$ at a flow rate of approximately 100 to about 1000 sccm, providing $O_2$ at a flow rate approximately 10 to about 300 sccm, introducing the third gas for the third time period of approximately 60 seconds, and maintaining the walls of the etching chamber at a temperature of approximately 50° C. to 80° C.

8. The method of claim 7 wherein introducing the third gas comprises utilizing a source power of approximately 100 to about 3000 Watts.

9. A method for cleaning an etching chamber, the method comprising:
    providing a plurality of wafer lots including at least one wafer;
    transporting the at least one wafer of each of the plurality of wafer lots into the etching chamber, wherein the at least one wafer of each of the plurality of wafer lots undergoes an etching process initializing a cleaning process of the etching chamber by;
    introducing a first gas comprising only an inert gas of argon into the etching chamber prior to transporting the at least one wafer of each of the plurality of wafer lots into the etching chamber wherein introducing the first gas comprises maintaining the walls of the etching chamber to a temperature of approximately 50° C. to approximately 80° C. and wherein introducing the first gas comprises utilizing a source power of approximately 100 to about 3000 Watts and bias power of approximately 0 Watts for approximately 600 seconds; and
    introducing a second gas after the first gas and prior to the transporting the at least one wafer, wherein the second gas includes at least one of $SF_6$ and $CF_4$.

10. The method of claim 9 wherein introducing the first gas comprises maintaining the etching chamber at a pressure of approximately 3.8 mTorr, and providing the first gas in the etching chamber at a flow rate of approximately 50 to about 1000 sccm for the approximately 600 seconds.

11. The method of claim 9 wherein the second gas comprises $CF_4$ and Ar or $CF_4$ and $O_2$.

12. The method of claim 11 wherein the introducing the second gas comprises providing a flow rate of approximately 100 to about 1000 sccm, providing $O_2$ at a flow rate approximately 10 to about 300 sccm, and maintaining the walls of the etching chamber at a temperature of approximately 50° C. to 80° C.

13. The method of claim 12 wherein introducing the second gas comprises utilizing a source power of approximately 100 to about 3000 Watts.

14. The method of claim 1, wherein the second gas is $CF_4$ and Ar.

15. The method of claim 1, wherein the second gas is $CF_4$ and $O_2$.

* * * * *